(12) United States Patent
Li et al.

(10) Patent No.: US 11,164,755 B1
(45) Date of Patent: Nov. 2, 2021

(54) ELECTRONIC PACKAGE AND METHOD FOR FABRICATING THE SAME

(71) Applicant: SILICONWARE PRECISION INDUSTRIES CO., LTD., Taichung (TW)

(72) Inventors: Yung-Ta Li, Taichung (TW); Yi-Chian Liao, Taichung (TW); Kong-Toon Ng, Taichung (TW); Chang-Fu Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 16/895,461

(22) Filed: Jun. 8, 2020

(30) Foreign Application Priority Data

Apr. 30, 2020 (TW) ................. 109114552

(51) Int. Cl.
| | |
|---|---|
| *H01L 21/56* | (2006.01) |
| *H01L 23/31* | (2006.01) |
| *H01L 21/78* | (2006.01) |
| *H01L 25/065* | (2006.01) |
| *H01L 23/00* | (2006.01) |

(52) U.S. Cl.
CPC ............ *H01L 21/561* (2013.01); *H01L 21/78* (2013.01); *H01L 23/3128* (2013.01); *H01L 25/0652* (2013.01); *H01L 24/16* (2013.01); *H01L 24/24* (2013.01); *H01L 24/32* (2013.01); *H01L 24/73* (2013.01); *H01L 2224/16227* (2013.01); *H01L 2224/24145* (2013.01); *H01L 2224/32225* (2013.01); *H01L 2224/73204* (2013.01)

(58) Field of Classification Search
CPC ....................................... H01L 24/32
See application file for complete search history.

(56) References Cited

U.S. PATENT DOCUMENTS

| | | | |
|---|---|---|---|
| 2013/0049227 A1* | 2/2013 | Kim ...................... | H01L 21/568 257/777 |
| 2016/0254218 A1* | 9/2016 | Hong .................... | H01L 21/565 257/773 |
| 2017/0250119 A1* | 8/2017 | Besancon ............. | H01L 23/562 |

* cited by examiner

*Primary Examiner* — William A Harriston
(74) *Attorney, Agent, or Firm* — Kelly & Kelley, LLP

(57) ABSTRACT

An electronic package and a method for fabricating the same are provided. The electronic package includes a stepped recess formed at a peripheral portion of a packaging module to release stress of the electronic package.

13 Claims, 8 Drawing Sheets

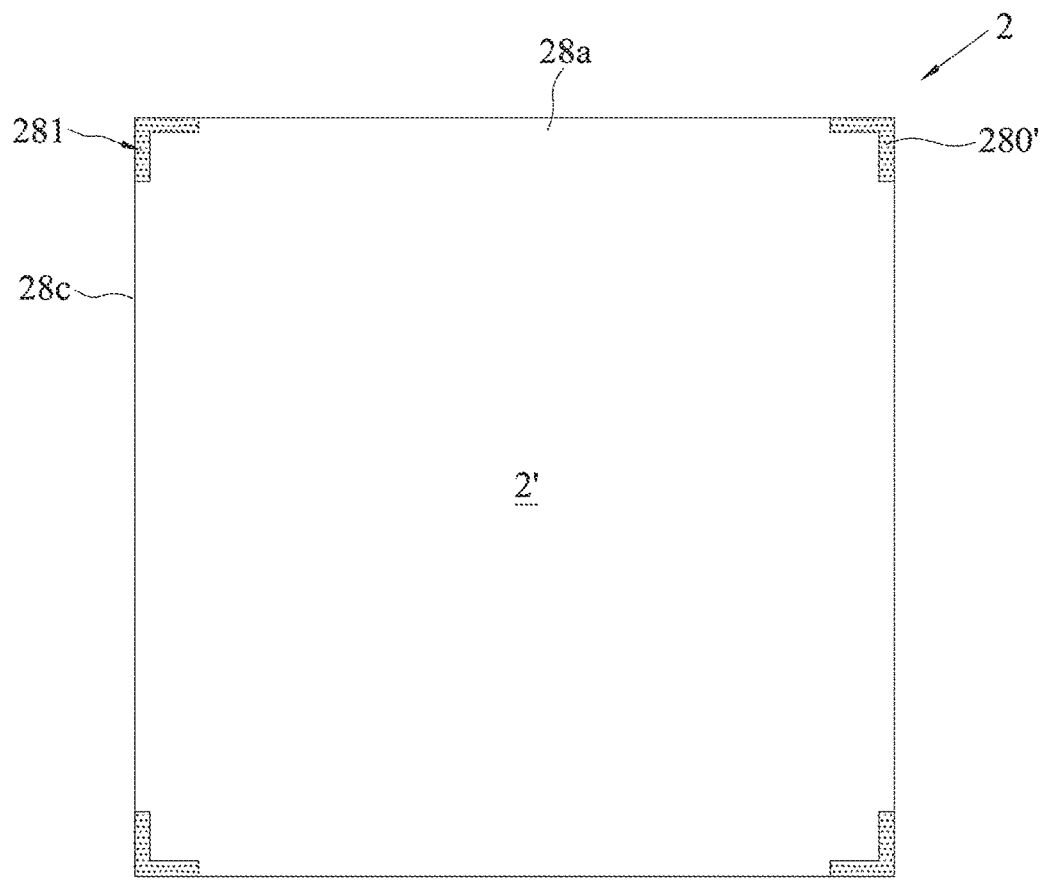
FIG. 2C'
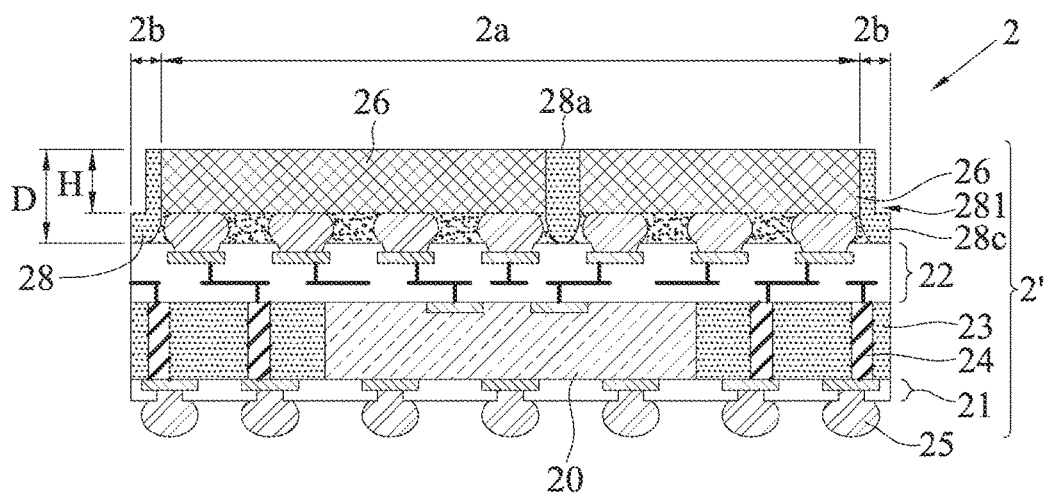
FIG. 2C"

ELECTRONIC PACKAGE AND METHOD FOR FABRICATING THE SAME

CROSS-REFERENCE TO RELATED APPLICATIONS

This application claims priority to Taiwan Application No. 109114552, filed on Apr. 30, 2020. The entirety of the above-mentioned patent application is hereby incorporated by reference herein and made a part of this specification.

BACKGROUND

1. Technical Field

The present disclosure relates to a packaging process, and more particularly, to a multichip electronic package and a method for fabricating the same.

2. Description of Related Art

With the rapid development of the electronic industry, electronic products are trending towards multiple functions and high performance. In order to meet the requirement for miniaturization of the electronic packages, a wafer level packaging (WLP) technique has been developed.

FIGS. 1A to 1E are cross-sectional views illustrating a method for fabricating a semiconductor package 1 using a conventional wafer level packaging technique.

As shown in FIG. 1A, a thermal release tape 100 is formed on a carrier 10.

Then, a plurality of semiconductor components 11 are disposed on the thermal release tape 100. Each of the semiconductor components 11 has an active face 11a and a non-active face 11b opposing to the active face 11a. A plurality of electrode pads 110 are provided on each of the active faces 11a, and each of the active faces 11a is attached onto the thermal release tape 100.

As shown in FIG. 1B, an encapsulant 14 is formed on the thermal release tape 100 to encapsulate the semiconductor components 11.

As shown in FIG. 1C, the encapsulant 14 is baked to cure the thermal release tape 100. The thermal release tape 100 and the carrier 10 are then removed to expose the active faces 11a of the semiconductor components 11.

As shown in FIG. 1D, a circuit structure 16 is formed on the encapsulant 14 and the active faces 11a of the semiconductor components 11, wherein the circuit structure 16 is electrically connected with the electrode pads 110. Thereafter, an insulating protective layer 18 is formed on the circuit structure 16, and parts of the surface of the circuit structure 16 are exposed from the insulating protective layer 18 for bonding with conductive components 17, such as solder balls.

As shown in FIG. 1E, a singulation process is performed along cutting paths S shown in FIG. 1D to obtain a plurality of semiconductor packages 1.

However, in the fabrication process of the conventional semiconductor package 1, the carrier 10 occupies the entire layout (i.e., the mass production size), and the semiconductor components 11 are only provided on one side of the carrier 10, so after the encapsulant 14 is formed, a mismatch in the coefficients of thermal expansion between the semiconductor components 11 and the encapsulant 14 easily causes uneven distribution of thermal stress and warpage of the encapsulant 14 during a thermal cycle and, in turn, resulting in issues such as detachment of the solder balls (i.e., the conductive components 17) or non-wetting of the conductive components 17.

Moreover, warpage may also make it difficult to place the structure being manufactured inside the machine or cause the semiconductor components 11 to crack, which lowers the production yield.

Therefore, there is a need for a solution that addresses the aforementioned shortcomings in the prior art.

SUMMARY

In view of the aforementioned shortcomings of the prior art, the present disclosure provides an electronic package, which includes: a packaging module defined with a chip placement portion and a peripheral portion surrounding the chip placement portion; and a packaging layer formed on the peripheral portion of the packaging module with a recess formed at a boundary corner of the packaging layer.

In the electronic package above, the recess has a step-like shape.

The present disclosure further provides a method for fabricating an electronic package, which includes: providing a plurality of packaging modules arranged in a matrix, wherein each of the packaging modules is defined with a chip placement portion and a peripheral portion surrounding the chip placement portion, and each of the packaging modules adjoins one another via respective peripheral portion; forming a packaging layer on the peripheral portion; forming at least one recess on the packaging layer at a boundary corner corresponding to the peripheral portion; and performing a singulation process along the peripheral portions of the packaging modules arranged in the matrix to obtain the electronic package having the recess formed at a boundary corner of the packaging layer after the singulation process.

In the fabricating method above, the recess may be formed by removing a portion of the packaging layer by laser.

In the electronic package and the method for fabricating the same, before the singulation process, the recess in one of the packaging modules has an L shape, and is in communication with an adjacent recess, and after the singulation process, the recess is provided at a corner of the packaging layer, and the recess includes forming a depression at a sidewall of the packaging layer, so that the recess has an L shape on a surface of the packaging layer.

In the electronic package and the method for fabricating the same, before the singulation process, the recess surrounds one of the packaging modules and forms a loop shape, and is in communication with an adjacent recess, and after the singulation process, the recess is provided along edges of the packaging layer and includes a depression formed at a sidewall of the packaging layer, so that the recess forms a loop shape on a surface of the packaging layer.

In the electronic package and the method for fabricating the same, a depth of the recess is between 15% and 60%, for example, between 20% and 40% of a thickness of the packaging layer.

In the electronic package and the method for fabricating the same, a width of the recess is between 50% and 100%, for example, between 80% and 95% of a width of the peripheral portion.

In the electronic package and the method for fabricating the same, a chamfered face is formed at a corner of the recess.

As can be understood from the above, the electronic package of the present disclosure and the method for fabricating the same allow stress to be released at the time of singulation as a result of the recess formed on the packaging layer at the peripheral portion of the packaging module. Compared to the prior art, the fabricating method of the present disclosure improves warpage caused by factors such as thermal processes and reliability test, thereby effectively strengthening the electronic package.

BRIEF DESCRIPTION OF THE DRAWINGS

FIG. 2A' is a schematic cross-sectional view of FIG. 2A;

FIG. 2B' is another aspect of FIG. 2B;

FIG. 2C' is another aspect of FIG. 2C;

FIG. 2C" is a schematic cross-sectional view of FIG. 2C or FIG. 2C';

DETAILED DESCRIPTION

Figure 1A:
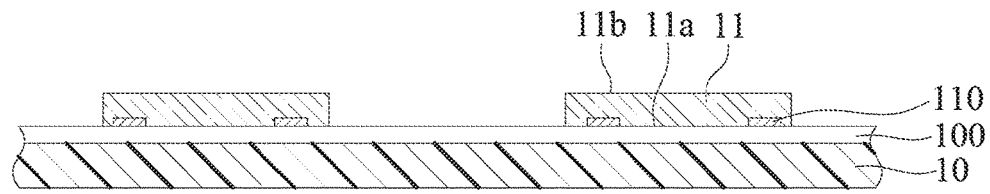
FIGS. 1A to 1E are schematic cross-sectional views illustrating a conventional method for fabricating a semiconductor package.
Figure 1B:
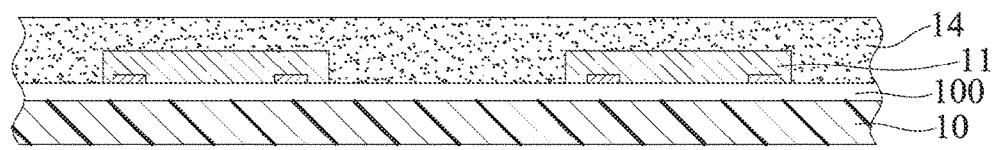
Figure 1C:
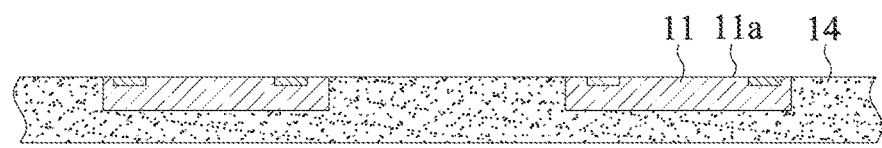
Figure 1D:
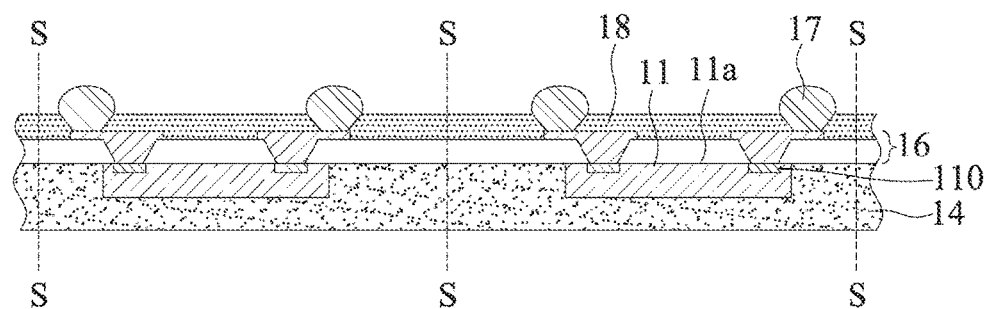
Figure 1E:
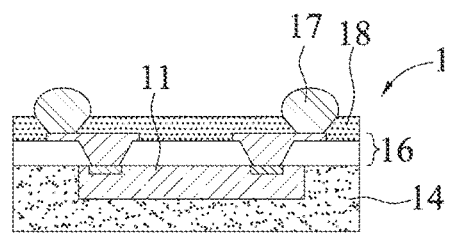

Implementations of the present disclosure are described below by specific embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as fall within the scope covered by the technical contents disclosed herein. Meanwhile, terms such as "above," "first," "second," "one," "a," "an," and the like, are for illustrative purposes only, and are not meant to limit the scope implementable by the present disclosure. Any changes or adjustments made to the relative relationships, without substantially modifying the technical contents, are also to be construed as within the scope implementable by the present disclosure.

Figure 2A:
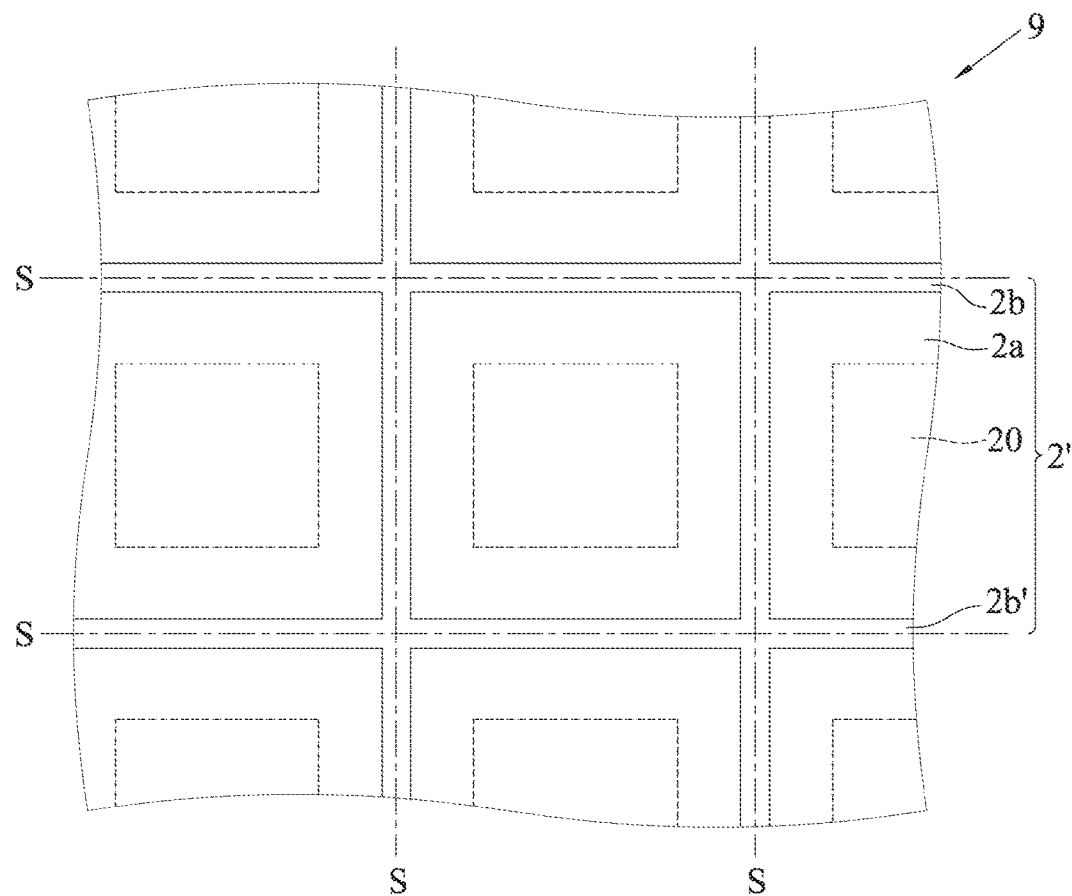
FIGS. 2A to 2C are schematic top views illustrating a method for fabricating electronic packages in accordance with the present disclosure.
Figure 2A:
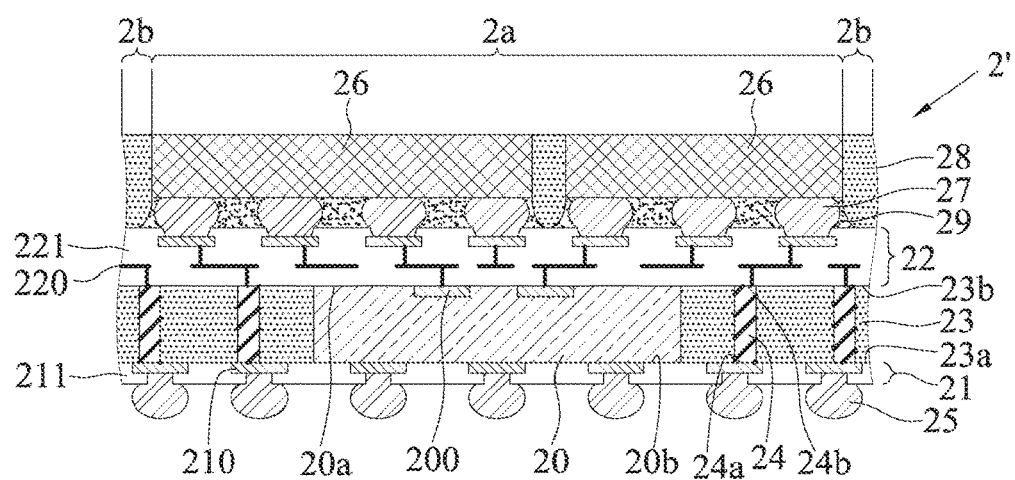
Figure 2B:
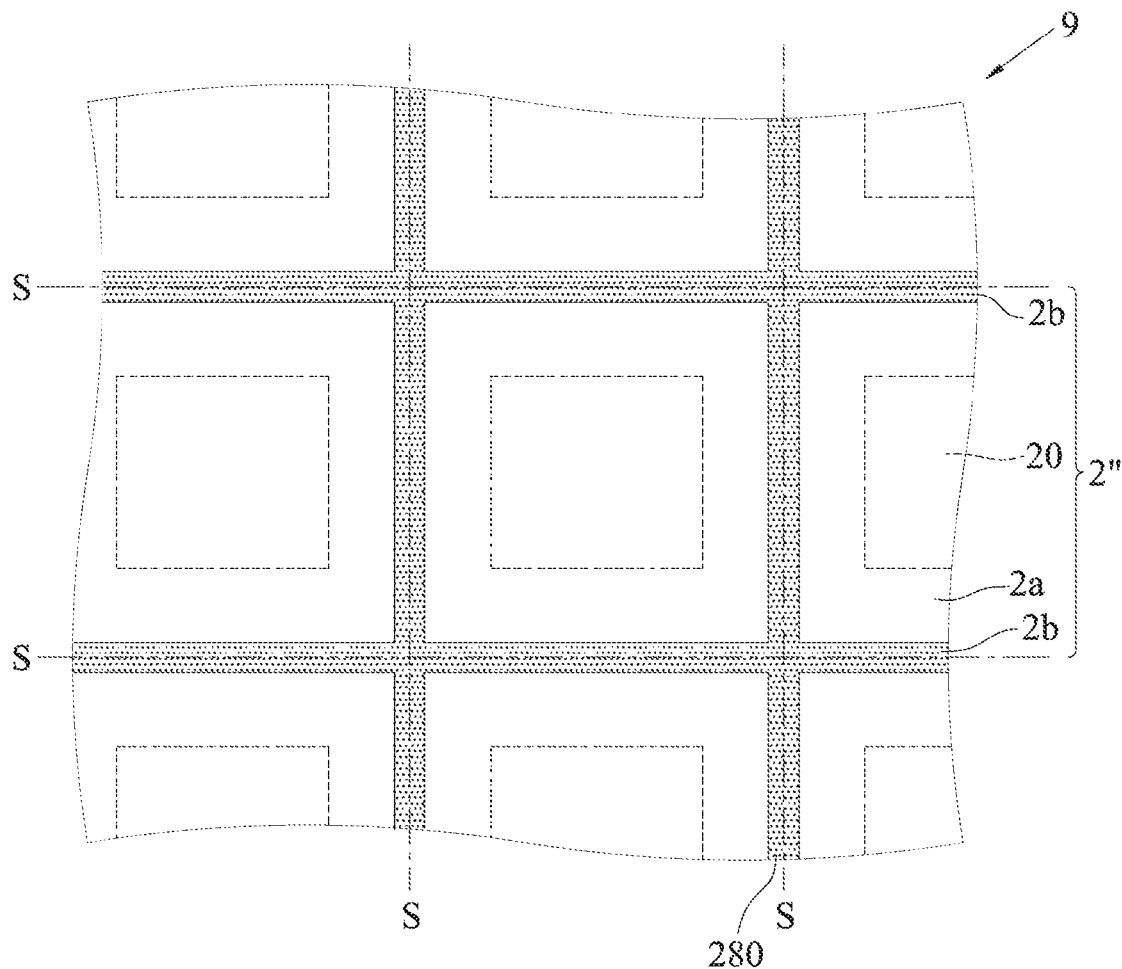
Figure 2B:
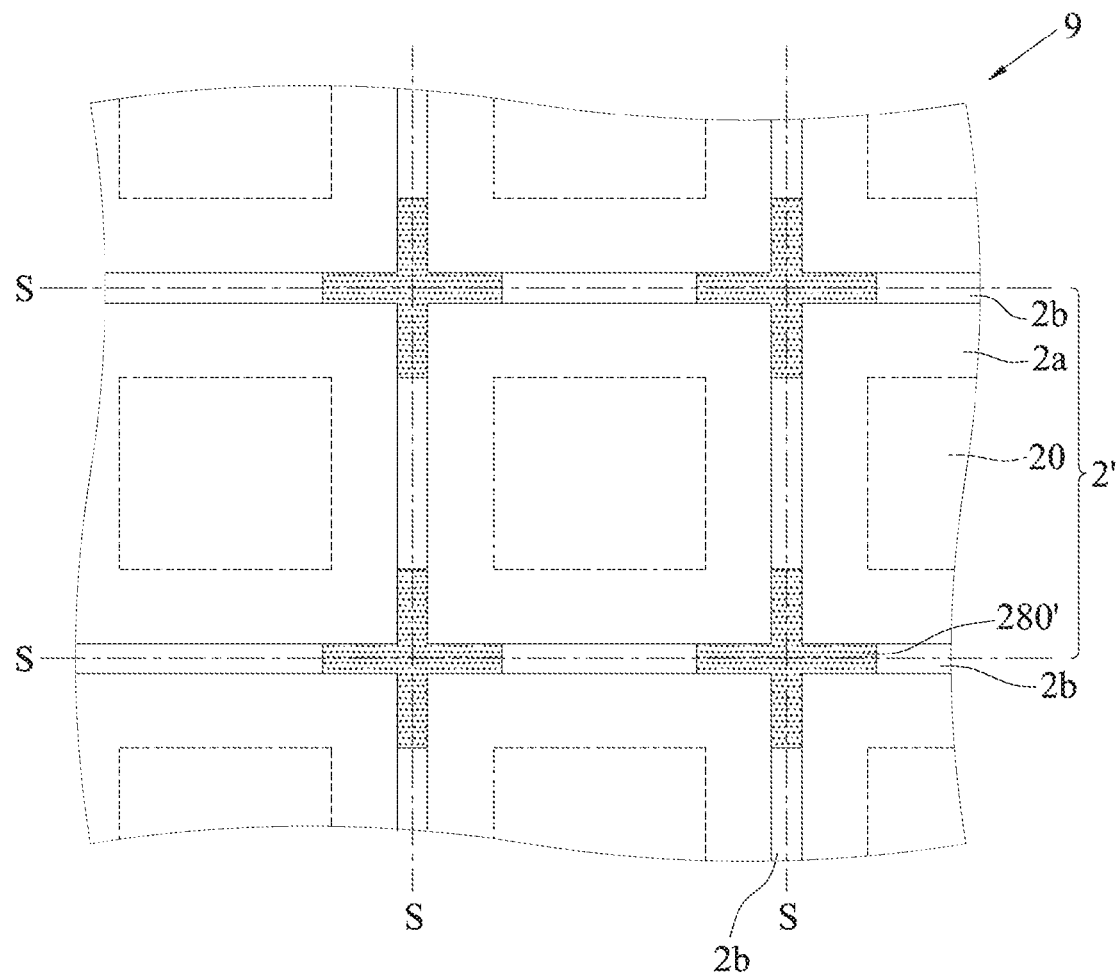
Figure 2C:
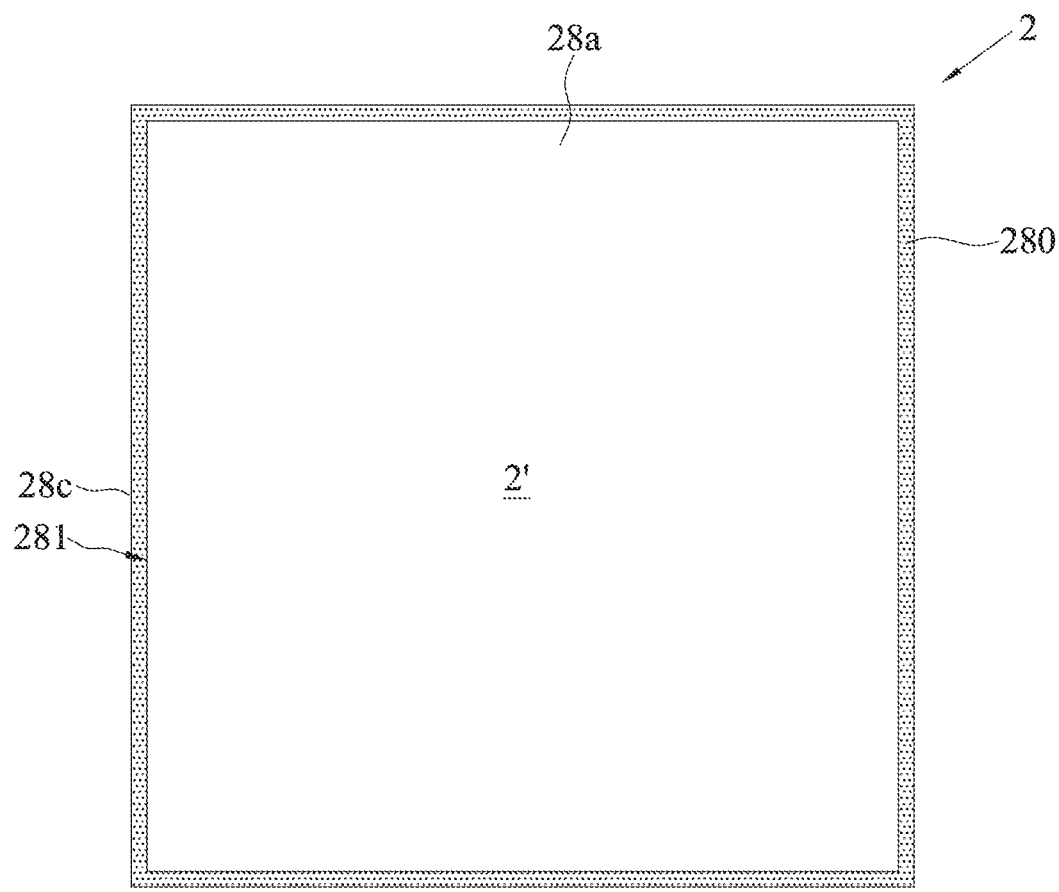

FIGS. 2A to 2C are schematic diagrams illustrating a method for fabricating electronic packages 2 in accordance with the present disclosure.

As shown in FIGS. 2A and 2A', a plurality of packaging modules 2' are formed in a matrix on a carrier (not shown). Each of the packaging modules 2' is defined with a chip placement portion 2a and a peripheral portion 2b surrounding the chip placement portion 2a, such that each of the packaging modules 2' adjoins one another through respective peripheral portion 2b. Then, a packaging layer 28 is formed on the peripheral portions 2b of the packaging modules 2', so that the packaging layer 28 encapsulates the packaging modules 2', thereby forming a full-layout packaging body 9, wherein the full-layout packaging body 9 is defined with cutting paths S along the peripheral portions 2b required for the subsequent singulation process. Subsequently, the carrier is removed.

In an embodiment, as shown in FIG. 2A', the packaging module 2' includes: an encapsulating layer 23, at least one first electronic component 20, a plurality of conductive pillars 24, a first circuit structure 21, a plurality of first conductive components 25, a second circuit structure 22, and at least one second electronic component 26, wherein the chip placement portion 2a is a block for arranging electronic components (i.e., the first electronic component 20 and/or the second electronic component 26) thereon.

The encapsulating layer 23 has a first surface 23a and a second surface 23b opposite to each other. In an embodiment, the encapsulating layer 23 is an insulating material, such as polyimide (PI), a dry film, an encapsulant or a molding compound (e.g., an epoxy resin). For example, the encapsulating layer 23 can be formed by liquid compound molding, injection, lamination, compression molding, or the like.

The first electronic component 20 is embedded in the encapsulating layer 23. In an embodiment, the first electronic component 20 can be an active component, a passive component or a combination of the two. The active component may be, for example, a semiconductor chip, and the passive component may be, for example, a resistor, a capacitor and an inductor. For example, the first electronic component 20 is a semiconductor chip having an active face 20a and a non-active face 20b opposite to each other. A plurality of electrode pads 200 are provided on the active face 20a. The active face 20a is exposed from (e.g., flush with) the second surface 23b of the encapsulating layer 23, and the non-active face 20b is exposed from (e.g., flush with) the first surface 23a of the encapsulating layer 23.

The conductive pillars 24 are embedded in the encapsulating layer 23. In an embodiment, the conductive pillar 24 has a first end 24a and a second end 24b opposite to each other. The first ends 24a of the conductive pillars 24 are exposed from (e.g., flush with) the first surface 23a of the encapsulating layer 23, while the end faces of the second ends 24b are exposed from (e.g., flush with) the second surface 23b of the encapsulating layer 23.

The first circuit structure 21 is disposed on the first surface 23a of the encapsulating layer 23 and the non-active face 20b of the first electronic component 20, and is electrically connected with the conductive pillars 24 but not electrically connected with the first electronic component 20. In an embodiment, the first circuit structure 21 includes at least one first redistribution layer (RDL) 210 electrically connected with the first ends 24a of the conductive pillars 24. For example, the first RDL 210 is in contact but not electrically connected with the non-active face 20b of the first electronic component 20. The first RDL 210 is formed from copper. The first circuit structure 21 may further include at least one first insulating layer 211 for laying out the first RDL 210. The first insulating layer 211 can be formed from a dielectric material or a solder resist, such as polybenzoxazole (PBO), PI, a prepreg (PP) material, etc. It can be appreciated that multiple layers of the first RDL 210 can be formed by the first insulating layer 211.

The first conductive components 25 are formed on the first circuit structure 21. In an embodiment, the first conductive components 25 include soldering materials, copper pillars, or other conductive materials. The first conductive components 25 are electrically connected with the first RDL 210.

The second circuit structure 22 is disposed on the second surface 23b of the encapsulating layer 23 and is electrically connected with the second ends 24b of the conductive pillars 24 and the electrode pads 200 of the first electronic component 20. In an embodiment, the second circuit structure 22 is formed on the second surface 23b of the encapsulating layer 23 through a RDL process. For example, the second circuit structure 22 includes at least one second insulating layer 221 and a second RDL 220 disposed on the second insulating layer 221. The outermost second insulating layer 221 can be used as a solder resist layer, and the outermost second RDL 220 is exposed from the solder resist layer. The second RDL 220 is formed from copper, and the second insulating layer 221 can be formed from a dielectric material, such as PBO, PI, a PP material, etc.

The second electronic component 26 is disposed on the second circuit structure 22 and is electrically connected with the second circuit structure 22. In an embodiment, the second electronic component 26 can be an active component, a passive component or a combination of the two. The active component may be, for example, a semiconductor chip, and the passive component may be, for example, a resistor, a capacitor and an inductor. For example, the second electronic component 26 is a semiconductor chip, such as a graphics processing unit (GPU), a high bandwidth memory (HBM), etc. The second electronic component 26 is electrically connected with the second RDL 220 via a plurality of second conductive components 27 (e.g., solder bumps, copper bumps etc.) in a flip-chip manner. An underfill 29 is formed between the second electronic component 26 and the second circuit structure 22 to encapsulate the second conductive components 27.

Moreover, the packaging layer 28 is formed on the second circuit structure 22 to encapsulate the underfill 29 and the second electronic component 26, wherein the packaging layer 28 fills up the peripheral portion 2b of the packaging module 2'. For example, the packaging layer 28 is an insulating material, such as PI, a dry film, an encapsulant or a molding compound (e.g., an epoxy resin), and can be formed on the second circuit structure 22 by lamination, molding, or the like.

Moreover, the material forming the packaging layer 28 is different from or the same as the material of the encapsulating layer 23.

In addition, the underfill 29 can be omitted, and the packaging layer 28 encapsulates both the second electronic component 26 and the second conductive components 27.

As shown in FIG. 2B, at least one recess 280 is formed on the packaging layer 28 at the boundary corner corresponding to the peripheral portion 2b, and the recess 280 does not penetrate the packaging layer 28 (or the peripheral portion 2b).

In an embodiment, the recess 280 is formed by removing a portion of the packaging layer 28 by laser or a cutting tool.

Moreover, the recess 280 can be formed along the peripheral portion 2b, such that it surrounds a single packaging module 2', such as that shown in FIG. 2B, in which the recess 280 is a continuous loop, and adjacent recesses 280 are in communication with one another. Alternatively, as shown in FIG. 2B', a recess 280' may also be formed on a portion of the peripheral portion 2b. For example, the recess 280' is only formed at the outer corner boundary of the chip placement portion 2a of a single packaging module 2'. The recess 280' has an L shape, and adjacent recesses 280' are in communication with one another, such that the adjacent recesses 280' of the packaging bodies 9 constitute a crisscross shape.

Figure 3A:
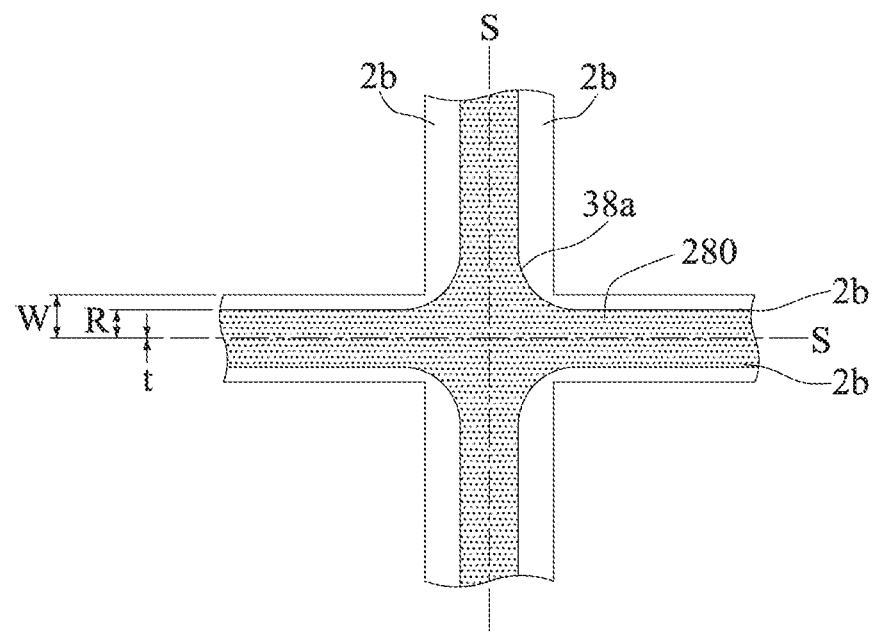
FIG. 3A is another aspect of FIG. 2B.
Figure 3B:
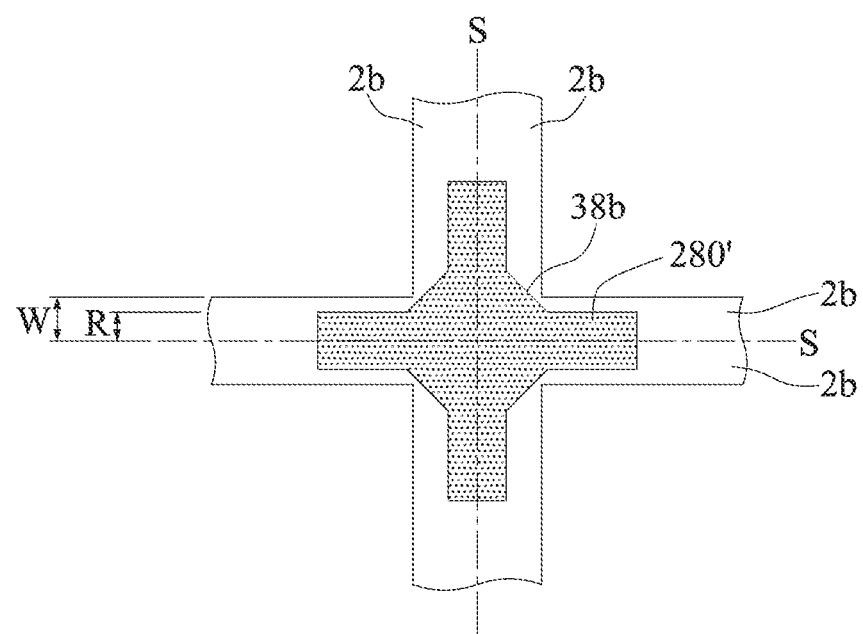
FIG. 3B is another aspect of FIG. 2B'.

In addition, as shown in FIG. 3A or FIG. 3B, the width R of the recess 280, 280' is 50%~100%, and preferably, 80%~95% of the width W of the peripheral portion 2b. It can be appreciated that the width R of the recess 280, 280' is chosen so as to effectively release the stress at the boundary corner of the packaging module 2'.

Furthermore, a chamfered face 38a, 38b can be formed at the corner of the recess 280, 280' depending on the needs, such as a rounded corner shown in FIG. 3A (a filleting process) or an angled corner shown in FIG. 3B (a chamfering process).

As shown in FIGS. 2B and 2C, a cutting tool (not shown) is used to perform singulation process along the cutting paths S to form a plurality of electronic packages 2. In a subsequent manufacturing process, the electronic package 2 can be disposed on a circuit board (not shown) via the first conductive components 25, wherein the electronic package 2 has a stepped recess 280, 280', that is, the boundary corner of the packaging layer 28 has the stepped recess 280, 280'.

In an embodiment, the width of the cutting tool (width t of the cutting path S shown in FIGS. 3A and 3B) must be smaller than the width R of the recess 280, 280', so that the recess 280, 280' can be realized on the electronic package 2.

Figure 4A:
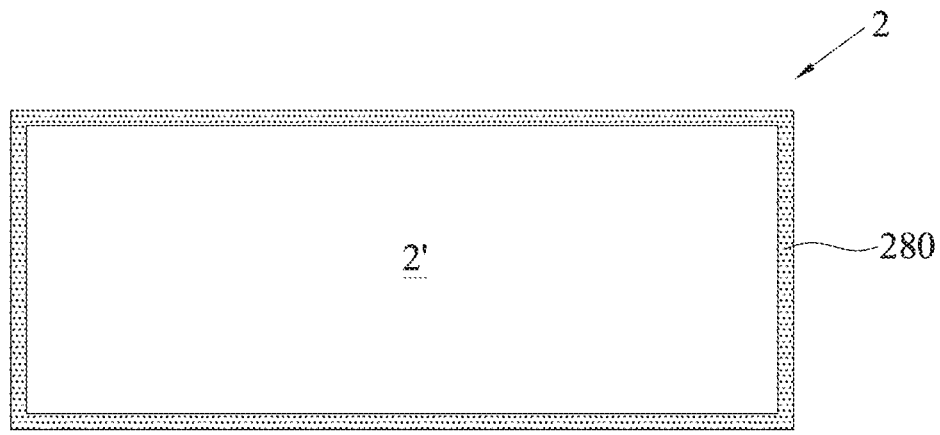
FIG. 4A is another aspect of FIG. 2C.
Figure 4B:
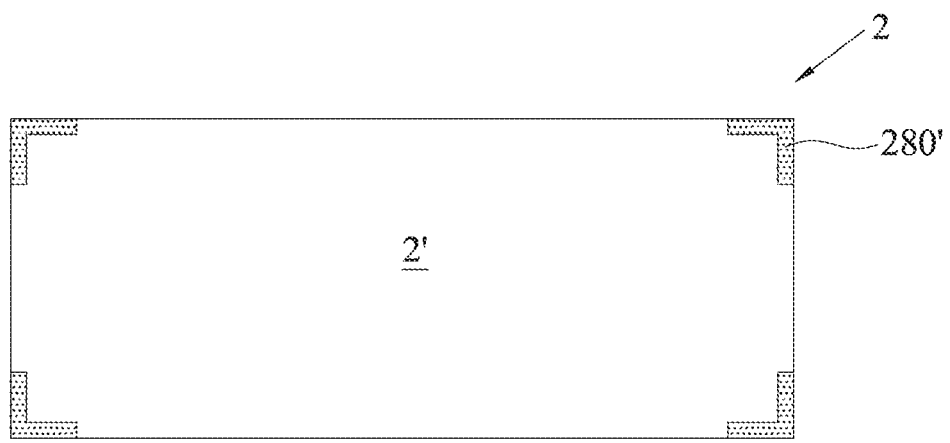
FIG. 4B is another aspect of FIG. 2C'.

Furthermore, the electronic package 2 is quadrangular in shape, such as square shown in FIGS. 2C and 2C' or rectangular as shown in FIGS. 4A and 4B.

In addition, the depth H of the recess 280, 280' is 15%-60%, and preferably, 20-40% of the thickness D of the packaging layer 28. It can be appreciated that the depth H of the recess 280, 280' is chosen so as to effectively release the stress at the boundary corner of the packaging module 2' while not affecting the flexibility of the full-layout packaging body 9.

Moreover, the recess 280 includes forming a depression 281 at the side wall 28c of the packaging layer 28, such that the recess 280 has a loop shape at the top surface 28a of the packaging layer 28 as shown in FIG. 2C. Alternatively, the recess 280' includes forming a depression 281 at the side wall 28c of the packaging layer 28, such that the recess 280' has an L shape at the top surface 28a of the packaging layer 28 as shown in FIG. 2C'.

Therefore, in the fabrication method of the present disclosure, the recess 280, 280' is formed at the peripheral portion 2b of the packaging module 2' before singulation process is performed, so that when singulation process is performed, the full-layout packaging body 9 can release the stress at the peripheral portion 2b (boundary corner) of the packaging module 2'. Compared to the prior art, the fabrication method of the present disclosure mitigates warpage created by the thermal processes and strengthens the electronic package 2, which makes it more successful in reliability test. For example, detaching and non-wetting issues associated with the solder balls (i.e., the first conductive components 25) can be avoided. This also precludes problems such as the electronic package 2 not being able to be placed inside the machine in the subsequent processes or cracks occurring in the first electronic component 20 or the second electronic component 26 that would result in a lowered production yield.

Moreover, when the recess 280 is covered the peripheral portion 2b of the packaging module 2', the edge thickness of the packaging layer 28 (where the depth H of the recess 280 is) is thinner, flexibility and stress release can be improved. This helps to mitigate warpage. Alternatively, when the recess 280' is formed only at the corners of the peripheral portion 2b of the packaging module 2', that is, when a stepped recess 280' is formed only at the corners of the peripheral portion 2b of the electronic package 2, the thickness D of the packaging layer 28 at the edges of the peripheral portion 2b is unchanged, stress can be released at the peripheral portion 2b of the electronic package 2, while higher rigidity can be obtained at the edges (where the thickness D is not diminished) of the peripheral portion 2b, thereby strengthening the overall structure of the electronic packages 2 and making it less likely to deform.

Moreover, with the provision of the chamfered face 38a, 38b, stress concentration can be further mitigated, thereby releasing more stress at the edges and the corners.

Furthermore, there are numerous types of electronic packages 2, and the present disclosure is not limited to the above. Thus, depending on the specifications of the electronic packages 2, the ratio of the depth H and the width R of the recess 280, 280' can be adjusted to attain optimum stress release.

The present disclosure further provides an electronic package 2 that includes a packaging module 2' and a packaging layer 28.

The packaging module 2' is defined with a chip placement portion 2a and a peripheral portion 2b surrounding the chip placement portion 2a.

The packaging layer 28 is formed on the peripheral portion 2b of the packaging module 2', and a recess 280, 280' is formed at the boundary corner of the packaging layer 28.

In an embodiment, the recess 280, 280' has a step-like shape. For example, the recess 280' is provided at the corners of the packaging layer 28, and a depression 281 is formed on the sidewall 28c of the packaging layer 28, such that the recess 280' has an L shape on the surface (e.g., a top surface 28a) of the packaging layer 28. Alternatively, the recess 280 is formed along the edges of the packaging layer 28, and a depression 281 is formed on the sidewall 28c of the packaging layer 28, such that the recess 280 forms a loop shape on the surface (e.g., the top surface 28a) of the packaging layer 28.

Furthermore, the depth H of the recess 280, 280' is 15%-60%, preferably 20%-40% of the thickness D of the packaging layer 28.

Furthermore, the width R of the recess 280, 280' is 50%-100%, preferably 80%-95% of the width W of the peripheral portion 2b.

In an embodiment, a chamfered face 38a, 38b is formed at a corner of the recess 280, 280'.

In conclusion, the electronic package of the present disclosure and the method for fabricating the same allow stress to be released as a result of the recess formed on the electronic package, thereby improving warpage caused by factors such as thermal processes and reliability test, and effectively strengthening the electronic package.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
    a packaging module defined with a chip placement portion and a peripheral portion surrounding the chip placement portion, wherein at least one electronic component is arranged on the chip placement portion, and a width of the peripheral portion is from an edge of the electronic component to an edge of the packaging module; and
    a packaging layer formed on the peripheral portion of the packaging module with a recess formed at a boundary corner of the packaging layer,
    wherein the recess has a step-like shape, and
    wherein the recess has a width of between 80% and 95% of the width of the peripheral portion.

2. The electronic package of claim 1, wherein the recess is provided along edges of the packaging layer and includes a depression formed on a sidewall of the packaging layer, and wherein the recess has a loop shape on a surface of the packaging layer.

3. The electronic package of claim 1, wherein the recess has a corner formed with a chamfered face.

4. The electronic package of claim 1, wherein the recess is provided along a corner of the packaging layer and includes a depression formed on a sidewall of the packaging layer, and wherein the recess has an L shape on a surface of the packaging layer.

5. The electronic package of claim 4, wherein the recess has a depth of between 15% and 60% of a thickness of the packaging layer.

6. The electronic package of claim 5, wherein the depth of the recess is between 20% and 40% of the thickness of the packaging layer.

7. A method for fabricating an electronic package, comprising:
    providing a plurality of packaging modules arranged in a matrix, wherein each of the packaging modules is defined with a chip placement portion and a peripheral portion surrounding the chip placement portion at least one electronic component is arranged on the chip placement portion, each of the packaging modules adjoins one another via respective peripheral portion, and a width of the peripheral portion is from an edge of the electronic component to an edge of the packaging module;
    forming a packaging layer on the peripheral portion;
    forming at least one recess on the packaging layer at a boundary corner corresponding to the peripheral portion; and
    performing a singulation process along the peripheral portions of the packaging modules arranged in the matrix to obtain the electronic package having the recess formed at a boundary corner of the packaging layer after the singulation process,
    wherein the recess has a width of between 80% and 95% of the width of the peripheral portion.

8. The method of claim 7, wherein before the singulation process, the recess in one of the packaging modules has an L shape, and is in communication with an adjacent recess.

9. The method of claim 8, wherein the recess has a depth of between 15% and 60% of a thickness of the packaging layer.

10. The method of claim 9, wherein the depth of the recess is between 20% and 40% of the thickness of the packaging layer.

11. The method of claim 7, wherein before the singulation process, the recess surrounds one of the packaging modules and forms a loop shape, and is in communication with an adjacent recess.

12. The method of claim 7, wherein the recess has a corner formed with a chamfered face.

13. The method of claim 7, wherein the recess is formed by removing a portion of the packaging layer by laser.

* * * * *